(12) United States Patent
Kim et al.

(10) Patent No.: US 12,379,768 B2
(45) Date of Patent: Aug. 5, 2025

(54) ELECTRONIC DEVICE AND METHOD OF CONTROLLING TEMPERATURE ASSOCIATED WITH A SEMICONDUCTOR DEVICE USING DYNAMIC VOLTAGE FREQUENCY SCALING (DVFS)

(71) Applicant: SAMSUNG ELECTRONICS CO., LTD., Suwon-si (KR)

(72) Inventors: Young San Kim, Yongin-si (KR); Jae Gon Lee, Seongnam-si (KR); Jae Young Lee, Hwaseong-si (KR); Woo Kyeong Jeong, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 363 days.

(21) Appl. No.: 17/951,540

(22) Filed: Sep. 23, 2022

(65) Prior Publication Data
US 2023/0195207 A1 Jun. 22, 2023

(30) Foreign Application Priority Data

Dec. 22, 2021 (KR) .................. 10-2021-0184812
Mar. 14, 2022 (KR) .................. 10-2022-0031319

(51) Int. Cl.
*G06F 1/3296* (2019.01)
(52) U.S. Cl.
CPC ................. *G06F 1/3296* (2013.01)
(58) Field of Classification Search
CPC .................................................. G06F 1/3296
See application file for complete search history.

(56) References Cited

U.S. PATENT DOCUMENTS

| 6,415,388 | B1 | 7/2002 | Browning et al. |
| 7,054,720 | B2 | 5/2006 | Cooper |
| 8,868,956 | B1 * | 10/2014 | Kraipak ............... G06F 1/26 713/340 |
| 8,874,949 | B2 | 10/2014 | Wells et al. |

(Continued)

FOREIGN PATENT DOCUMENTS

| KR | 20240016010 A * | 7/2022 | |
| WO | WO-2015008372 A1 * | 1/2015 | ........... G06F 1/26 |

*Primary Examiner* — Suresh Suryawanshi
(74) *Attorney, Agent, or Firm* — Fish & Richardson P.C.

(57) ABSTRACT

An electronic device includes; an intellectual property (IP) block, a thermal management unit (TMU) that detects a temperature associated with the IP block to generate a detected temperature, a clock management unit (CMU) that generates an operating clock and provides the operating clock to the IP block, a clock generator that controls operation of the CMU in generating the operating clock, a power management unit (PMU) that generates a supply voltage provided to the CMU, and a dynamic voltage frequency scaling (DVFS) block. The DVFS block includes; a critical path monitor (CPM) that monitors the operating clock, a frequency monitor that determines a current frequency for the operating clock, a target frequency module that determines a target frequency for the operating clock, an adder that compares the target frequency and the current frequency to generate frequency comparison results, and a decide voltage module that generates deciding results in response to the frequency comparison results, wherein the PMU adjusts a level of the supply voltage in response to the deciding results.

20 Claims, 8 Drawing Sheets

(56) References Cited

U.S. PATENT DOCUMENTS

| | | | |
|---|---|---|---|
| 8,972,759 B2 | 3/2015 | Doshi et al. | |
| 9,285,810 B2 | 3/2016 | Ko et al. | |
| 9,360,907 B2 | 6/2016 | Doshi et al. | |
| 9,378,803 B2 | 6/2016 | Song et al. | |
| 9,632,520 B2 | 4/2017 | Park et al. | |
| 10,007,310 B2 | 6/2018 | Saeidi et al. | |
| 10,606,335 B2 * | 3/2020 | Gu et al. | |
| 2008/0122421 A1 * | 5/2008 | Hsieh | G06F 1/3203 323/318 |
| 2013/0173938 A1 * | 7/2013 | Yang | G06F 1/206 713/300 |
| 2015/0095010 A1 * | 4/2015 | Brock | G06F 30/20 703/21 |
| 2015/0134995 A1 * | 5/2015 | Park | G06F 11/3058 713/340 |
| 2016/0062437 A1 * | 3/2016 | Kim | G06F 1/3228 713/322 |

* cited by examiner

ELECTRONIC DEVICE AND METHOD OF CONTROLLING TEMPERATURE ASSOCIATED WITH A SEMICONDUCTOR DEVICE USING DYNAMIC VOLTAGE FREQUENCY SCALING (DVFS)

CROSS-REFERENCE TO RELATED APPLICATIONS

This U.S. patent application claims priority under 35 U.S.C. 119 to Korean Patent Application No. 10-2021-00184812 filed on Dec. 22, 2021, and Korean Patent Application No. 10-2022-0031319 filed on Mar. 14, 2022, the collective subject matter of which is hereby incorporated by reference in its entirety.

BACKGROUND

Field

The inventive concept relates generally to electronic devices, and more particularly semiconductor devices, that use dynamic voltage frequency scaling.

Description of Related Art

Dynamic voltage frequency scaling (DVFS) is a control approach that dynamically adjusts an operating frequency and/or an operating voltage within an electronic system or an electronic device, such as a semiconductor device.

As performed within certain semiconductor devices, DVFS may periodically "pole" (or check) circuitry associated with the semiconductor device, such as an adjustment target circuit. Thus, periodic poling results may be used to adjust an operating frequency and/or an operating voltage associated with the semiconductor device (e.g., an operating frequency and/or an operating voltage provided to the adjustment target circuit). In this manner, operation of the adjustment target circuit may be dynamically checked and adjusted in order to reduce overall power consumption, reduce a current level, reduce a voltage level, maintain a desired performance level, etc.

In this regard, there is a need to control one or more temperature(s) associated with the semiconductor device using DVFS.

SUMMARY

Embodiments of the inventive concept provide electronic devices exhibiting improved temperature control.

According to embodiments of the inventive concept, an electronic device may include; an intellectual property (IP) block, a thermal management unit (TMU) that detects a temperature associated with the IP block to generate a detected temperature, a clock management unit (CMU) that generates an operating clock and provides the operating clock to the IP block, a clock generator that controls operation of the CMU in generating the operating clock, a power management unit (PMU) that generates a supply voltage provided to the CMU, and a dynamic voltage frequency scaling (DVFS) block. The DVFS block may include; a critical path monitor (CPM) that monitors the operating clock, a frequency monitor that determines a current frequency for the operating clock, a target frequency module that determines a target frequency for the operating clock, an adder that compares the target frequency and the current frequency to generate frequency comparison results, and a decide voltage module that generates deciding results in response to the frequency comparison results, wherein the PMU adjusts a level of the supply voltage in response to the deciding results.

According to embodiments of the inventive concept, a method controlling temperature in an electronic device including an intellectual property (IP) block may include; providing an operating clock to the IP block, providing a supply voltage to a dynamic voltage frequency scaling (DVFS) block performing dynamic voltage frequency scaling on the IP block, determining a target frequency for the operating clock, determining a current frequency for the operating clock, comparing the target frequency and the current frequency to generate frequency comparison results, generating deciding results in response to the frequency comparison results, and controlling a level of the supply voltage in response to the deciding results.

According to embodiments of the inventive concept, a method controlling temperature in an electronic device including an intellectual property (IP) block may include; generating an operating clock using a Phase-Locked Loop (PLL), providing the operating clock to the IP block, wherein a temperature of the IP block is related to the frequency of the operating clock, providing a supply voltage to a critical path monitor (CPM) of a dynamic voltage frequency scaling (DVFS) block that performs dynamic voltage frequency scaling on the IP block, determining a target frequency for the operating clock, determining a current frequency for the operating clock, comparing the target frequency and the current frequency to generate frequency comparison results, generating deciding results in response to the frequency comparison results, and controlling a level of the supply voltage in response to the deciding results.

BRIEF DESCRIPTION OF DRAWINGS

Advantages, benefits, and features, as well as the making and use of the inventive concept may be better understood upon consideration of the following detailed description, together with the accompanying drawings, in which.

DETAILED DESCRIPTION

Throughout the written description and drawings, like reference numbers and labels are used to denote like or similar elements, components, features and/or method steps.

Figure 1:
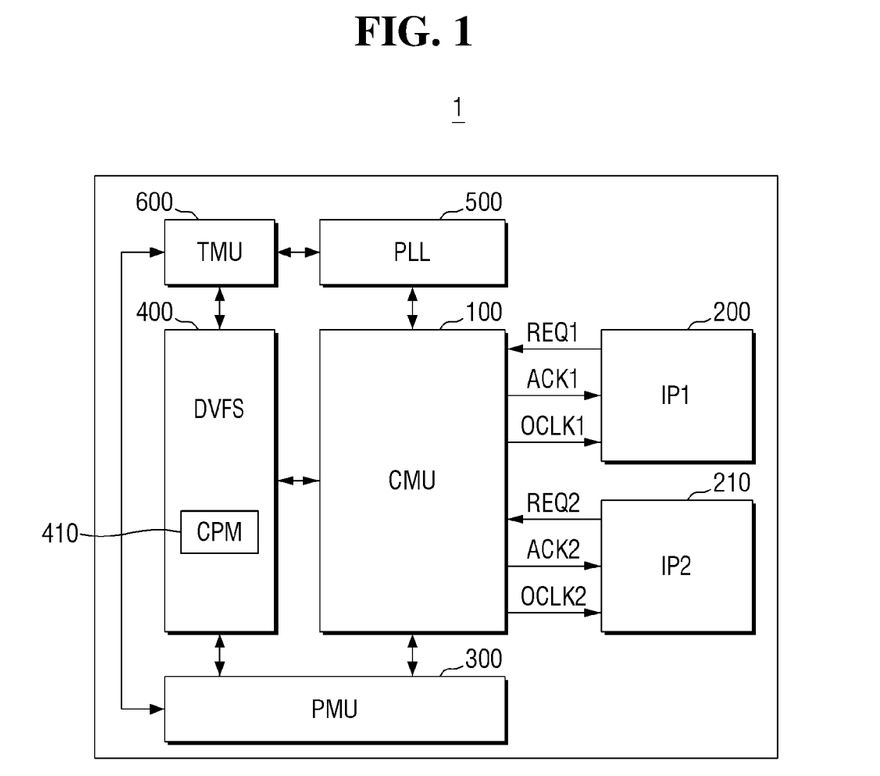
FIG. 1 is a block diagram illustrating a semiconductor device (e.g., a System-on-Chip, or SoC) according to embodiments of the inventive concept.

FIG. 1 is a block diagram illustrating a semiconductor device 1 (e.g., a SoC) according to embodiments of the inventive concept.

Referring to FIG. 1, the semiconductor device 1 may include a clock management unit (CMU) 100, a first intellectual property (IP) block 200, a second IP block 210, a power management unit (PMU) 300, a dynamic voltage frequency scaling (DVFS) block 400, a clock generator (e.g., a Phase-Lock-Loop of PLL) 500, and a thermal management unit (TMU) 600. (In the description that follows, a clock signal will be referred to simply as a "clock").

The CMU 100 may be used to generate one or more operating clock(s) variously provided to the first IP block 200 and the second IP block 210. For example, the CMU 100 may generate a first operating clock OCLK1 related to the operation of the first IP block 200 and a second operating clock OCLK2 related to the operation of the second IP block 210.

Here, the first IP block 200 and the second IP block 210 may be interconnected and may communicate one with another through system bus (not shown in FIG. 1). In some embodiments, one or both of the first IP block 200 and the second IP block 210 may include, for example; a processor, a graphics processor, a memory controller, an input/output (I/O) interface block, etc. Alternately or additionally, the first IP block 200 and the second IP block 210 may include respective processors distinguished by different computational capabilities (e.g., a large core processor and small core processor).

The illustrated example of FIG. 1 shows two IP blocks, however those skilled in the art will appreciate that a different number of IP blocks may be included in other embodiments of the inventive concept.

In some embodiments, at least one of the first IP block 200 and the second IP block 210 may variously communicate (e.g., send (or transfer) and/or receive) a clock request signal with the CMU 100 using (e.g.,) using a full handshaking scheme. For example, the first IP block 200 may send a first clock request signal REQ1 to the CMU 100 using the full handshaking scheme. Upon receipt of the first clock request signal REQ1, the CMU 100 may send (or return) a first clock response signal ACK1 to the first IP block 200, and the CMU 100 may then send the first operation clock OCLK1 to the first IP block 200.

In similar vein, the second IP block 210 may send a second clock request signal REQ2 to the CMU 100 using the full handshaking scheme. Upon receiving the second clock request signal REQ2, the CMU 100 may send a second clock response signal ACK2 to the second IP block 210, and send the second operation clock OCLK2 to the second IP block 210.

It follows from the foregoing description that various interface(s) between the CMU 100 and each one of the first IP block 200 and the second IP block 210 may operate in such a manner to facilitate the full handshaking scheme. Thus, in some embodiments, the interfaces may be implemented as to operate as an ARM Q-channel interface or P-channel interface.

Clock gating is a control approach that effectively divides an electronic system into smaller functional blocks, and then selectively connects power to currently operational blocks and disconnects power to currently non-operational blocks. Since not all blocks of the electronic system are usually operational at the same time, the selective connection of power to operational blocks tends to reduce overall power consumption and thermal loading (e.g., heating) of the electronic system.

Extending this principle to the working example of FIG. 1, during operation of the semiconductor 1, one or both of the first IP block 200 and the second IP block 210 may, at times, be operational or a non-operational. Accordingly, the CMU 100 may selectively perform clock gating with respect to the first IP block 200 and the second IP block 210. For example, the CMU 100 may performs sequential clock gating of the first IP block 200 and the second IP block 210. In this regard, the CMU 100 performs clock gating in relation to the first IP block 200 and the second IP block 210 such that an error in operation does not occur in the operation of either IP block. Accordingly, clock gating—however specifically implemented—may be used to reduce overall power consumption by the semiconductor device 1.

The PMU 300 may be used to define (or control) one or more voltages within the semiconductor device 1. For example, when the semiconductor device 1 enters a standby mode, the PMU 300 may turn OFF a power control circuit to cut off (or interrupt) a supply voltage provided to the semiconductor device 1. Here, the standby mode may be an operating mode for the semiconductor device 1 corresponding to an absence of clock requests from the first IP block 200 and the second IP block 210.

In some embodiments, the PMU 300 may be configured to be always-on during operation of the semiconductor device 1, and therefore may continuously consumes power. However, the amount of power consumed by the PMU 300 is relatively low, as compared to with the overall power consumed by the semiconductor device 1. Accordingly, power consumption during the standby mode, will be significantly reduced in relation to active mode(s) of the semiconductor device 1.

Of further note, the PMU 300 may cut off the supply voltage to the CMU 100 when the semiconductor device 1 is in the standby mode.

The DVFS block 400 may be used to perform one or more dynamic voltage/frequency scaling operation(s) in relation to the first IP block 200 and the second IP block 210. In some embodiments, the DVFS block 400 may perform a closed loop DVFS operation on one or both of the first IP block 200 and the second IP block 210.

In some embodiments, the DVFS block 400 may monitor one or more clock(s) provided to (or to-be-provided to) at least one of the first IP block 200 and the second IP block 210 via an inner loop in order to generate clock monitoring results. And, if necessary, the DVFS block 400 may adjust the frequency of one or more clock(s) provided to the at least one of the first IP block 200 and the second IP block 210 in response to the clock monitoring results.

Alternately or additionally, the DVFS block 400 may monitor one or more voltage(s) provided to at least one of the first IP block 200 and the second IP block 210 via an outer loop in order to generate voltage monitoring results. And, if necessary, the DVFS block 400 may adjust a characteristic (e.g., a level) of the one or more voltage(s) provided to the at least one of the first IP block 200 and the second IP block 210 in response to the voltage monitoring results.

In the illustrated example of FIG. 1, the DVFS block 400 is assumed to be a separate computational component capable of performing one or more DVFS operation(s) in relation to the first IP block 200 and the second IP block 210. However, those skilled in the art will appreciate that the DVFS block 400 may be variously implemented in combination with one or more of the CMU 100, the PMU 300, the clock generator (PLL) 500, and/or the TMU 600.

Figure 2:
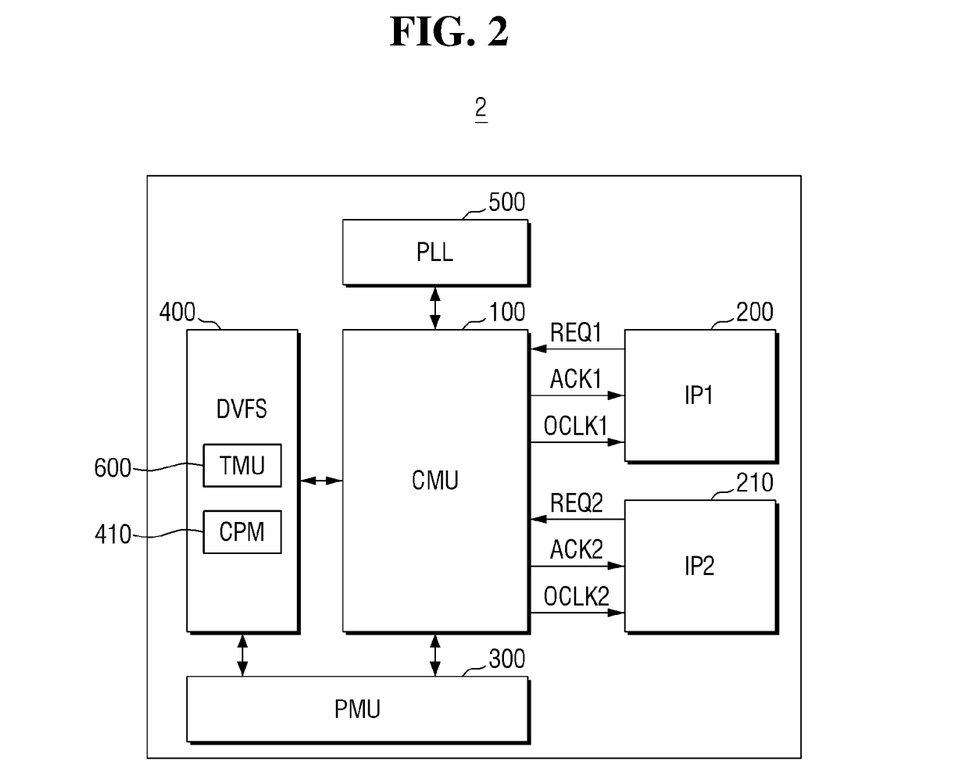
FIG. 2 is a block diagram illustrating another semiconductor device (SoC) according to embodiments of the inventive concept.

In this regard, FIG. 2 is a block diagram illustrating another semiconductor device 2 (e.g., a SoC) according to embodiments of the inventive concept. And comparing the semiconductor device 1 of FIG. 1 with the semiconductor device 2 of FIG. 2, circuitry performing the functionality of the TMU 600 is included within the DVFS block 400.

Referring to FIGS. 1 and 2, the DVFS block 400 may further include a Critical Path Monitor (CPM) 410. In operation, for example, the CPM 410 may monitor the first operating clock OCLK1 provided to the first IP block 200 as part of a DVFS operation applied to the first IP block 200. That is, the CPM 410 may be used to monitor at least one characteristic (e.g., a level or a frequency) of the first operating clock OCLK1 provided to the first IP block 200 in order to generate first clock monitoring results. And, as necessary, the CPM 410 may be used to adjust the at least one characteristic of the first operating clock OCLK1 provided to the first IP block 200 in response to the first clock monitoring results.

Alternately or additionally, the CPM 410 may be used to monitor the second operating clock OCLK2 provided to the second IP block 210 as part of a DVFS operation applied to the second IP block 210. That is, the CPM 410 may be used to monitor at least one characteristic (e.g., a level or a frequency) of the second operating clock OCLK2 provided to the second IP block 210 in order to generate second clock monitoring results. And, as necessary, the CPM 410 may be used to adjust the characteristic of the second operating clock OCLK2 provided to the second IP block 210 in response to the second clock monitoring results.

Although only one CPM 410 is shown in FIGS. 1 and 2, those skilled in the art will appreciate that multiple CPMs may be variously implemented within the DVFS block 400, or elsewhere in a semiconductor device according to embodiments of the inventive concept. For example, the DVFS block 400 may include a first CPM monitoring and adjusting the first operating clock OCLK1 provided to the first IP block 200, and a second CPM 410 monitoring and adjusting the second operating clock OCLK2 provided to the second IP block 210, wherein the first CPM and the second CPM are independent of one another.

In some embodiments, the DVFS block 400 may include a number of CPMs corresponding to a number of IP blocks included in the semiconductor device 1 or the semiconductor device 2. That is, assuming the inclusion of n IP blocks within the semiconductor device 1 or the semiconductor device 2, where 'n' is a positive integer, the DVFS block 400 may include n CPMs.

The clock generator (PLL) 500 may be used to generate one or more clock(s) (e.g., one or more operating clock(s)) necessary to the operation of the semiconductor device 1 or the semiconductor device 2. In some embodiment, the clock generator 500 may include a Phase-Locked Loop (PLL), but other embodiments of the inventive concept are not limited thereto.

The TMU 600 may be used to monitor one or more temperature(s) associated with the semiconductor device 1 or the semiconductor device 2. For example, the TMU 600—including one or more temperature sensors—may be used to monitor a first temperature associated with the first IP block 200 and a second temperature associated with the second IP block 210. Alternately or additionally, the TMU 600 may be used to monitor one or more temperature(s) associated with the clock generator 500, the DVFS 400, the PMU 300 and/or the CMU 100.

Figure 3:
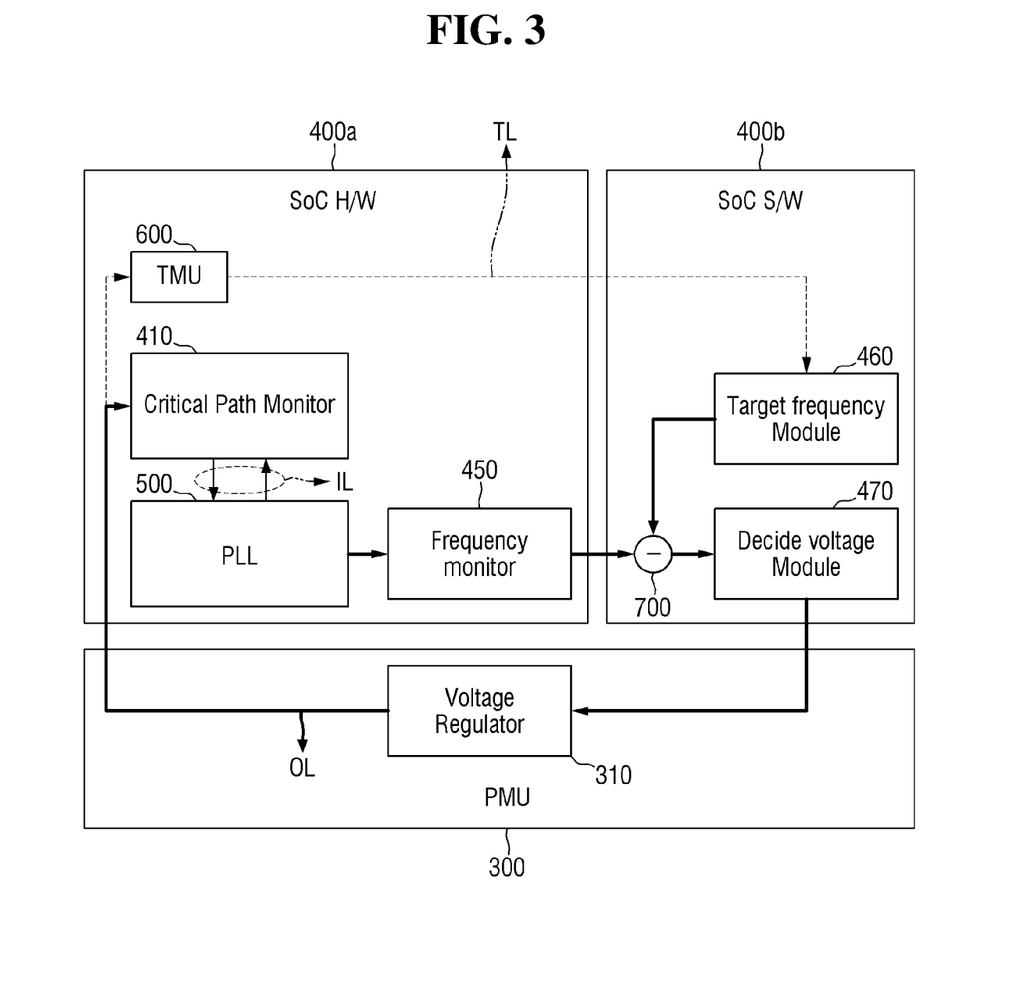
FIG. 3 is a block diagram further illustrating operation of the dynamic voltage frequency scaling (DVFS) block 400 of FIGS. 1 and 2.

FIG. 3 is a block diagram further illustrating operation of the DVFS block 400 of FGS. 1 and 2.

For illustrative and descriptive purposes, FIG. 3 illustrates a more particular version of the DVFS block 400 as being implemented as a SoC including hardware component(s) (H/W) 400a and software component(s) (S/W) 400b. Here, those skilled in the art will recognize that the boundaries between hardware and software components are merely descriptive in nature, and may be arbitrarily redrawn in relation to other embodiments of the inventive concept.

Within the SoC hardware, the CPM 410 and the PLL 500 may constitute an inner loop IL and an outer loop OL. Here, within the inner loop IL and in accordance with a timing period established for the inner loop IL (e.g., an inner loop IL period), the CPM 410 may variously monitor an operating speed for the constituent semiconductor device in order to generate speed monitoring results, which may be fed back from the CPM 410 to the clock generator 500 during each inner loop IL period. In this regard, various clock characteristics (e.g., frequency), power consumption characteristics, etc. may be related to the speed monitoring results. Thus, in some embodiments, the CPM 410 may monitor the frequency of a particular clock generated by the clock generator 500 during each inner loop IL period, and generate clock frequency monitoring results that may then be used to calculate a current operating speed of circuitry within the semiconductor device. The clock generator 500 may be provided with the speed monitoring results as the feedback signal that may be used to adjust, as necessary, one or more clock characteristics for one or more operating clocks in response to the speed monitoring results.

In some embodiments, the CPM 410 may be used to monitor an operating clock provided to one or more IP blocks during an inner loop period, and generate a speed code, including one or more digital bits, as one type of speed monitoring results. The speed code generated by the CPM 410 may then be provided to the clock generator 500. Thereafter, depending on established threshold value(s), one or more characteristics (e.g., a frequency) of an operating clock generated by the clock generator 500 may be adjusted. In this manner, the CPM 410 may control the adjustment (or non-adjustment) of one or more characteristics of various operating clock(s) generated by the clock generator 500.

In contrast to the inner loop IL substantially including only the CPM 410 and the clock generator 500, the outer loop OL may include the CPM 410, the clock generator 500, a frequency monitor 450, a target frequency module 460, a decide (or determination) voltage module 470, and the PMU 300 (e.g., a voltage regulator 310).

An outer loop OL period established for the output loop OL may be longer (e.g., have a longer duration) than that of the inner loop IL period. Accordingly, two or more inner loop operations (e.g., operations performed in accordance with the inner loop period) may be performed within a single outer loop OL period. It follows that during execution (or performing) of an outer loop operation (e.g., an operation performed in accordance with the outer loop period), multiple inner loop operations may be performed.

For example, the target frequency module 460 may be used multiple times during the execution of an outer loop operation to determine an average frequency for an operating clock OCLK. Alternately or additionally, the decide voltage module 470 may be used multiple times during the execution of an outer loop operation to determine the level of a supply voltage.

In some embodiments, the average frequency determined by the target frequency module 460 may be provided to an adder 700 that compares the average frequency to a current frequency monitored by the frequency monitor 450 in order to generate frequency comparison results that may be provided to the decide voltage module 470. In response to a deciding results generated by the decide voltage module 470 in response to the frequency comparison results provided by the adder 700, the voltage regulator 310 may (or may not) adjust a supply voltage by providing the CPM 410.

A functional combination of the TMU 600, the target frequency module 460, and the PMU 300 (e.g., the voltage regulator 310) may constitute a temperature determination loop TL. In this regard, the target frequency module 460 may be used to adjust a target frequency in response to temperature information received from the TMU 600.

For example, it is assumed that the TMU 600 uses a temperature sensor to detect a temperature associated with an IP block in accordance with an established (e.g., using empirical data) temperature range. A maximum temperature of the temperature range may be defined as a threshold temperature over which normal operation of the IP block cannot be ensured. In this regard, the term "normal operation" denotes any operation by the IP block resulting in deviation from an established technical specification or performance requirement.

The target frequency module 460 may be used to adjust a target frequency in response to temperature data detected by the TMU 600 (e.g., in relation to an IP block). That is, upon determining that a current temperature for an IP block is approaching, equal to, or exceeds a threshold temperature (e.g., a maximum temperature associated with a temperature range for the IP block), the target frequency module 460 may operate to decrease a target frequency for an operating clock associated with the IP block. Thereafter, the comparator 700 may be used to calculate a difference (e.g., a frequency comparison results) between the reduced target frequency and the frequency monitored by the frequency monitor 450. The decide voltage module 470 may then be used to determine deciding results in response to the frequency comparison results provided by the comparator 700, and the deciding results may be provided to the voltage regulator 310.

Therefore, according to the foregoing description, those skilled in the art will appreciate that an electronic device (e.g., a semiconductor device) according embodiments of the inventive concept may detect a temperature associated with the semiconductor device in real time using the temperature determination loop TL, adjust the frequency of an operating clock in response to the detected temperature (or temperature information indicating the detected temperature), and adjust a supply voltage in response to the adjusted frequency. In this manner, a temperature-controlled supply voltage may be provided to one or more components of the electronic device to prevent the detected temperature from exceeding a threshold temperature (or exceeding the threshold temperature more than a predetermined period of time).

Figure 4:
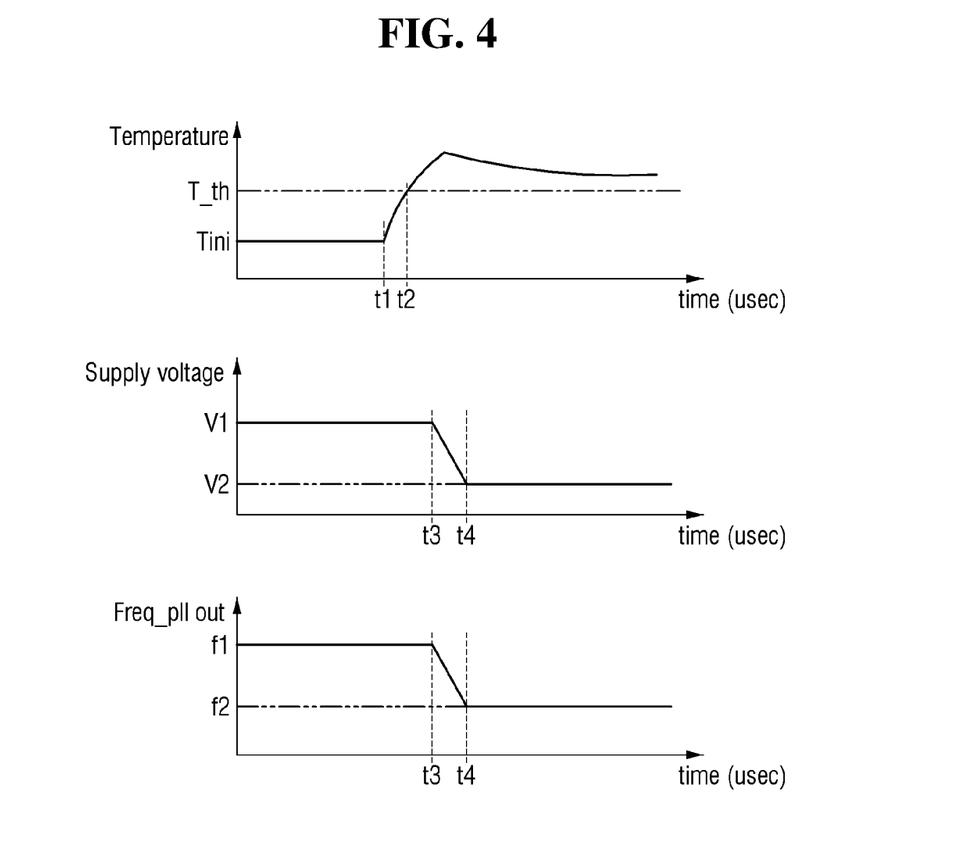
FIG. 4 is a timing diagram further illustrating operation of the DVFS block 400 of FIG. 3.

FIG. 4 is a timing diagram further illustrating operation of the DVFS block 400a/400b of FIG. 3.

Referring to FIGS. 3 and 4, the DVFS block 400a/400b may be used to control (e.g., detect and adjust) one or more temperatures associated with the a semiconductor device using a temperature determination loop TL. Here, a "Temperature" is assumed to be associated with an IP block of a semiconductor device.

From upper graph of FIG. 4, it can seen that the Temperature begins to increase at time t1 from an initial (or nominal) temperature level Tini. By time t2, the Temperature reaches a threshold temperature T_th (e.g., a maximum temperature of a temperature range for the IP block's normal operation). At this point in time, the target frequency module 460 may then determine to adjust (e.g., reduce) the level of the Temperature in response to a detected temperature (or related temperature information) provided by the TMU 600. In this regard as may be seen from the middle graph of FIG. 4, some delay may exist between a time at which the target frequency module 460 receives the detected temperature (or related temperature information) from the TMU 600 and a time at which a previously established target frequency is adjusted by the target frequency module 460.

However, once the target frequency module 460 decreases the target frequency, an operative combination of the adder 700, the decide voltage module 470 and the voltage regulator 310 may cause a level of a supply voltage to decrease from a first voltage V1 to a (lower) second voltage V2 over an interval between time t3 and time t4. And as the level of the supply voltage decreases from the first voltage V1 at time t3 to the second voltage V2 at time t4, so too does the frequency of an operating clock (Freq_ppl out) provided by the clock generator 500 decrease from a first frequency f1 at time t3 to a second frequency f2 at time t4.

In this manner, a semiconductor device according to embodiments of the inventive concept may provide efficient real time, or near real time, temperature control by variously controlling the frequencies of one or more operating clocks and/or the levels of one or more supply voltages.

Figure 5:
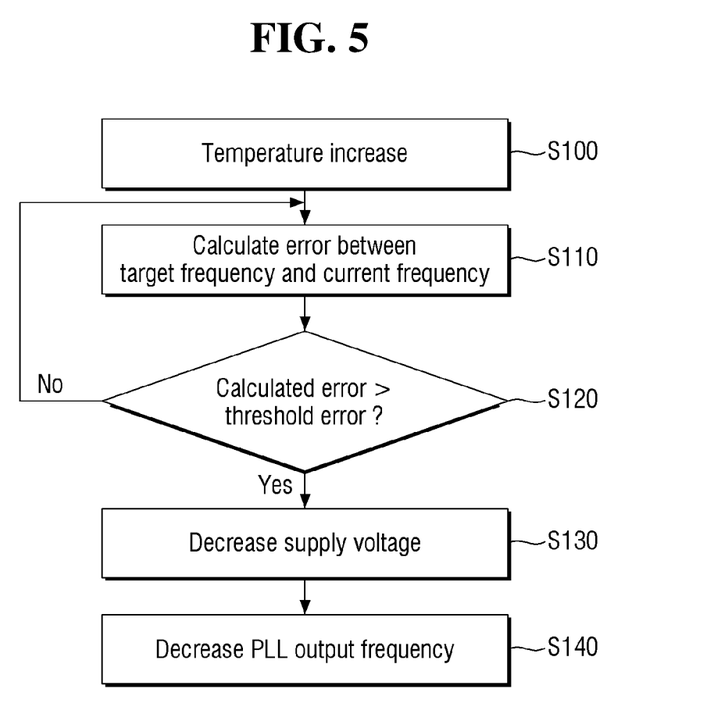
FIG. 5 is a flowchart illustrating operation of a DVFS block according to embodiments of the inventive concept.

FIG. 5 is a flowchart further illustrating operation of a DVFS block according to embodiments of the inventive concept.

Referring to FIGS. 3, 4 and 5, real time, or near real time control over the Temperature may be provided using the temperature determination loop TL.

Initially the Temperature increases (S100), and the increasing Temperature is monitored as it rises towards the threshold temperature using a detected temperature or related temperature provided by the TMU 600, as well as the target frequency provided by the target frequency module 460.

Thus, as the Temperature continues to rise towards the threshold temperature, a difference (or error) between the target frequency and the current frequency of an operating clock signal provided by the frequency monitor 450 may be calculated (e.g., frequency comparison results) using the comparator 700 (S110).

The decide voltage module 470 determines whether the calculated error between the target frequency and the current frequency exceeds a threshold error (S120). So long as the calculated error does not exceed the threshold error (S110=No), the decide voltage module 470 will not adjust a characteristic (e.g., a level) of the supply voltage. However, upon determining that the calculated error exceeds the threshold error (S110=Yes), the decide voltage module 470 may generate deciding results that decrease the level of the supply voltage (S130). For example, the deciding results may be applied to the voltage regulator 310 of the PMU 300 as a feedback control signal, such that the voltage regulator 310 generates an adjusted supply voltage having a reduced (V1 to V2) level. Thereafter, upon receiving the reduced supply voltage, the clock generator 500 may generate the operating clock with a reduced frequency (f1 to f2) (S140).

In this manner, a semiconductor device according to embodiments of the inventive concept may efficiently control various temperatures, such as temperatures associated with different components of the semiconductor device. For example, a temperature associated with an IP block may be controlled by adjusting a target frequency for an operating clock, comparing a current frequency of the operating clock with the target frequency of the operating clock, adjusting a supply voltage in response to the comparison between the current frequency and the target frequency, and then providing the adjusted supply voltage to a clock generator generating the operating clock.

Figure 6:
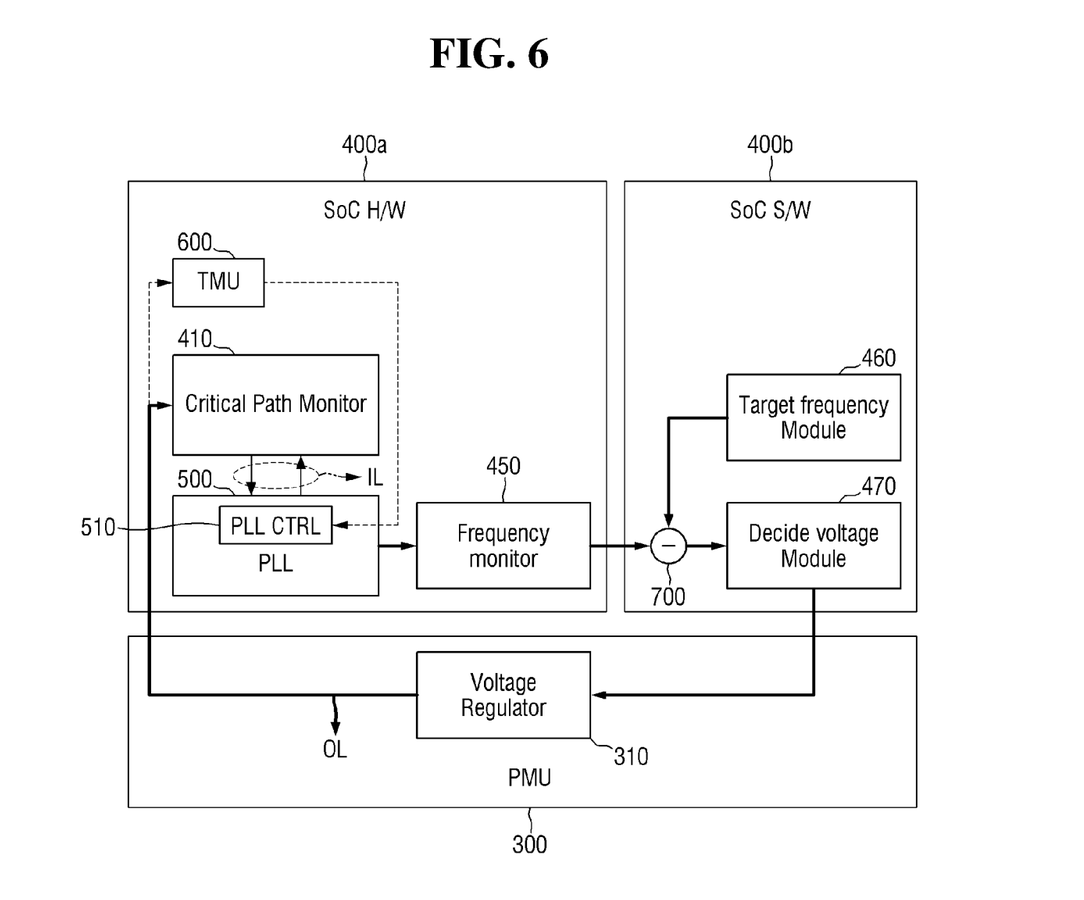
FIG. 6 is a block diagram illustrating operation of a DVFS block according to embodiments of the inventive concept.

FIG. 6 is a block diagram illustrating operation of the DVFS block 400 of FIGS. 1 and 2 and may be compared with the block diagram of FIG. 3. Here again the DVFS block 400 may be conceptualized as including hardware components 400*a* and software components 400*b*.

Referring to FIGS. 3 and 6, the clock generator (PLL) 500 of FIG. 6 receives a detected temperature (or related temperature information) directly from the TMU 600.

Thus, assuming that the clock generator 500 is a PLL, a PLL controller 510 may be provided internal to the PLL that controls the frequency (e.g., adjustments to) of one or more operating clock(s) in response to the detected temperature. That is, the PLL 500 may directly adjust the frequency one or more operating clock(s) in response to the detected temperature provided by the TMU 600, thereby improving timeliness of the control response to temperature changes in the semiconductor device.

Figure 7:
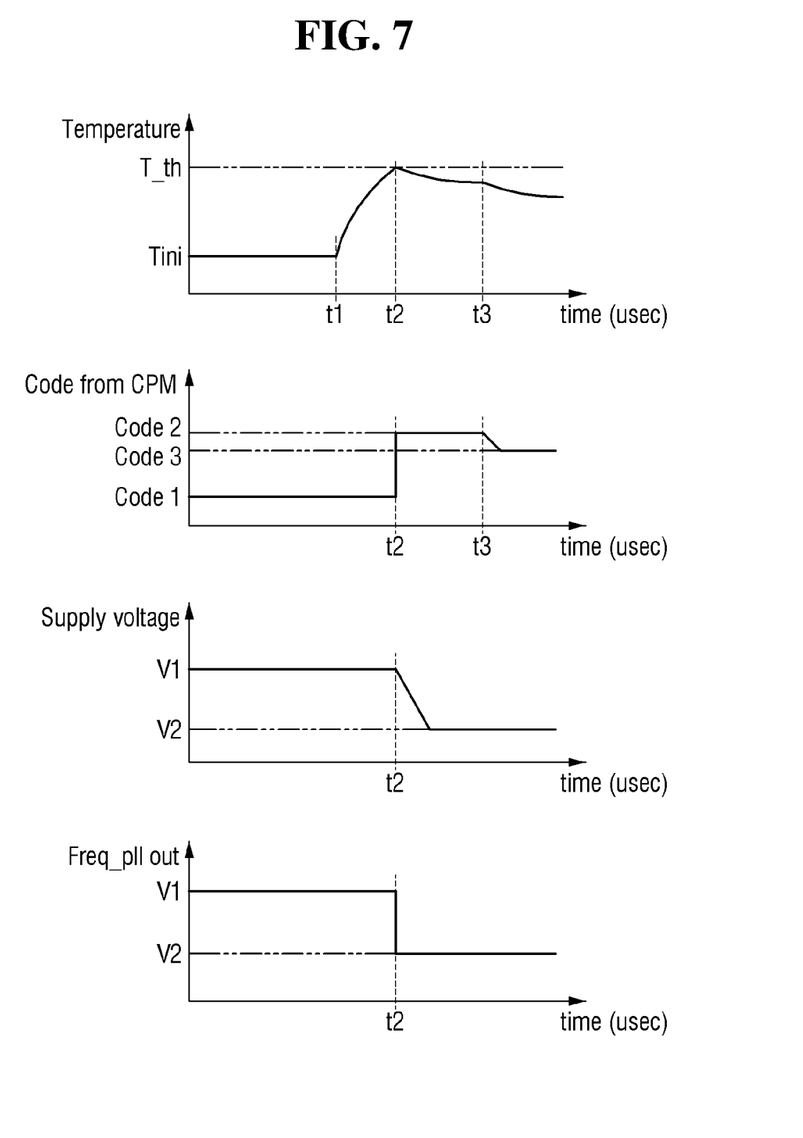
FIG. 7 is a timing diagram further illustrating operation of the DVFS block of FIG. 6.

FIG. 7 is a timing diagram further illustrating operation of the DVFS block 400 of FIG. 6 and may be compared with the timing diagram of FIG. 4.

Referring to FIGS. 6 and 7, control of a "Temperature" associated with an IP block of a semiconductor device will be described.

The Temperature increases from an initial (or nominal) temperature Tini at time t1. Then, at time t2, the Temperature approaches a threshold temperature T_th (e.g., a maximum temperature for a normal operation temperature range of the IP block).

Accordingly, at about time t2, the PLL controller 510 may be used to detect that the Temperature is approaching the threshold temperature T_th, and decrease the frequency (e.g., from f1 to f2) of an operating clock associated with the IP block and generated by the PLL 500. For example, a supply voltage provided by the voltage regulator 310 and associated with the operation of the IP block may be reduced from the first voltage V1 to the second voltage V2.

In some embodiments, during inner loop operation(s), the CPM 410 may change a first code (Code 1) to a second code (Code 2) and outputs the second code at time t2 in response to an adjusted output of the PLL 500. (Here, each code among various "codes" may be respectively related to a corresponding temperature. For example, a detected temperature may be converted to a corresponding code using an analog-to-digital converter).

As a result, the temperature of the IP block may begin decreasing at time t2. The CPM 410 may generate a third code (Code) 3, again during inner loop operations, at a time t3. At this time, the supply voltage and the frequency of the operating clock provided by the PPL 500 may not have changed. This is because the temperature of the IP block of the semiconductor device is below the threshold temperature. It follows that the code generated by the CPM 410 may be changed from Code 2 to Code 3 for various reasons.

Figure 8:
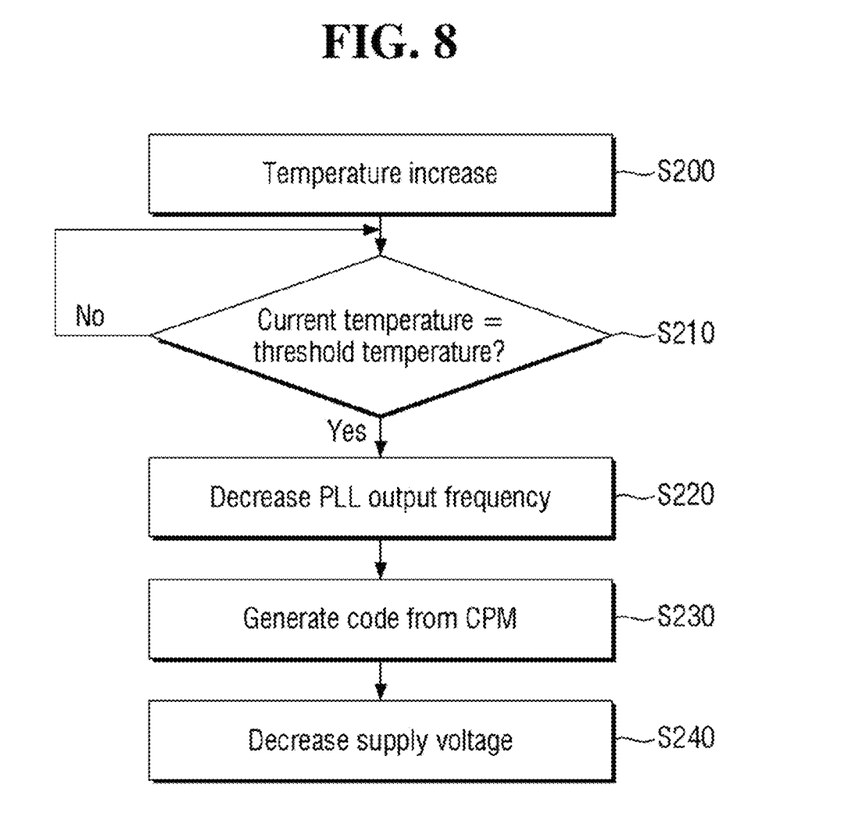
FIG. 8 is a flowchart illustrating operation of a DVFS block according to embodiments of the inventive concept.

FIG. 8 is a flowchart further illustrating operation of the DVFS block of FIGS. 6 and 7 according to embodiments of the inventive concept.

Referring to FIGS. 6, 7 and 8, operation controlling the Temperature of an IP block of the semiconductor device is again assumed.

Initially, the Temperature increases (S200).

The PLL controller 510 may be used to determine whether a current Temperature reaches a threshold temperature (S210). If not (S210=No), the PLL controller 510 does not adjust the frequency of an operating clock associated with the IP block and generated by the PLL 500.

However, upon determining, using the PLL controller 510, that the current Temperature has reached the threshold temperature (S210=Yes), the PLL controller 510 may decrease the frequency of the operating clock (S220). Accordingly, the CPM 41 may generate a new code (S230).

Thereafter, the voltage determination module 470 may reduce the supply voltage provided by the PLL 500 in response to the changed frequency (S240).

Hence, when the temperature of the IP block decreases, an electronic device according to embodiments of the inventive concept may increase the frequency of the PLL generated operating clock in response to frequency comparison results between the current temperature of the IP block with a threshold temperature for the IP block, thereby controlling temperature of the IP block.

Although the inventive concept have been described above in relation to certain illustrated embodiment, those skilled in the art will appreciate that various modifications to same may be made without departing from the scope of the inventive concept, as defined by the following claims.

What is claimed is:

1. An electronic device, comprising:
an intellectual property (IP) block;
a thermal management unit (TMU) configured to detect a temperature associated with the IP block to generate a detected temperature;
a clock management unit (CMU) configured to generate an operating clock, provide the operating clock to the IP block, and perform clock gating with respect to the IP block using a full handshaking scheme;
a clock generator configured to control operation of the CMU in generating the operating clock;
a power management unit (PMU) configured to generate a supply voltage provided to the CMU; and
a dynamic voltage frequency scaling (DVFS) block including:
a critical path monitor (CPM) configured to generate a speed code and transmit the speed code to the clock generator, the speed code indicates an operating speed of the operating clock;
a frequency monitor configured to determine, based upon the speed code, a current frequency for the operating clock;
a target frequency module configured to determine a target frequency for the operating clock;
an adder configured to compare the target frequency and the current frequency to generate frequency comparison results; and
a decide voltage module configured to generate deciding results in response to the frequency comparison results,
wherein the PMU is configured to adjust a level of the supply voltage in response to the deciding results.

2. The electronic device of claim 1, wherein the TMU is integrated within the DVFS block.

3. The electronic device of claim 1, wherein the clock generator includes a Phase-Locked Loop (PLL).

4. The electronic device of claim 1, wherein the CMU is configured to provide the operating clock to the IP block using a full handshaking scheme.

5. The electronic device of claim 1, wherein the PMU includes a voltage regulator configured to receive the deciding results from the decide voltage module, and adjust the supply voltage provided to the CPM.

6. The electronic device of claim 1, wherein the target frequency module is configured to determine the target frequency in relation to a maximum temperature of a temperature range associated with operation of the IP block.

7. The electronic device of claim 1,
wherein the clock generator and the CPM are arranged in an inner loop, and
wherein the clock generator, the CPM, the frequency monitor, the target frequency module, the decide voltage module, and the PMU are arranged in an outer loop.

8. A method of controlling temperature in an electronic device including an intellectual property (IP) block, the method comprising:
providing, by a clock management circuit, an operating clock to the IP block;
providing a supply voltage to a dynamic voltage frequency scaling (DVFS) block configured to perform dynamic voltage frequency scaling on the IP block, the DVFS comprising a critical path monitor (CPM) configured to generate a speed code that indicates an operating speed of the operating clock;
determining a target frequency for the operating clock;
determining, based upon the speed code, a current frequency for the operating clock;
comparing the target frequency and the current frequency to generate frequency comparison results;
generating deciding results in response to the frequency comparison results; and
controlling a level of the supply voltage in response to the deciding results,
wherein the clock management circuit is configured to perform clock gating with respect to the IP block using a full handshaking scheme.

9. The method of claim 8, wherein the providing of the operating clock to the IP block is performed by a clock management unit.

10. The method of claim 9, wherein the providing of the operating clock to the IP block is performed by the clock management unit under control of a Phase-Locked Loop (PLL).

11. The method of claim 10,
wherein the CPM and the PLL are arranged in an inner loop operating in response to an inner loop period.

12. The method of claim 11,
wherein the determining of the target frequency is performed by a target frequency module,
wherein the determining of the current frequency is performed by a frequency monitor,
wherein the comparing of the target frequency and the current frequency to generate the frequency comparison results is performed by an adder,
wherein the generating of the deciding results in response to the frequency comparison results is performed by a decide voltage module, and
wherein the frequency monitor, the target frequency module, the adder, and the decide voltage module are arranged in an outer loop operating in response to an outer loop period longer than the inner loop period.

13. The method of claim 8, wherein the controlling of the level of the supply voltage in response to the deciding results comprises:
providing the deciding results to a voltage regulator; and
using the voltage regulator to adjust the level of the supply voltage.

14. The method of claim 8, wherein the electronic device is a semiconductor device.

15. A method of controlling temperature in an electronic device including an intellectual property (IP) block, the method comprising:
generating an operating clock using a Phase-Locked Loop (PLL);
providing the operating clock to the IP block, wherein a temperature of the IP block is related to a frequency of the operating clock;
providing a supply voltage to a critical path monitor (CPM) of a dynamic voltage frequency scaling (DVFS) block, the DVFS block being configured to perform dynamic voltage frequency scaling on the IP block, and the CPM being configured to generate a speed code that indicates an operating speed of the operating clock;
determining a target frequency for the operating clock;
determining, based upon the speed code, a current frequency for the operating clock;
comparing the target frequency and the current frequency to generate frequency comparison results;
generating deciding results in response to the frequency comparison results; and
controlling a level of the supply voltage in response to the deciding results.

16. The method of claim 15, wherein the generating of the operating clock using the PLL comprises:
generating the speed code in the CPM of the DVFS block in response to the supply voltage; and
providing the speed code to a PLL controller controlling operation of the PLL.

17. The method of claim 16, wherein the determining of the current frequency for the operating clock comprises:
detecting a current temperature using a thermal management unit (TMU); and
providing the current temperature to the PLL controller.

18. The method of claim 15, wherein the controlling of the level of the supply voltage in response to the deciding results comprises:
providing the deciding results to a voltage regulator; and
using the voltage regulator to adjust the level of the supply voltage.

19. The method of claim 15, wherein the CPM and the PLL are arranged in an inner loop operating in response to an inner loop period.

20. The method of claim 19,
wherein the determining of the target frequency is performed by a target frequency module,
wherein the determining of the current frequency is performed, based on the speed code, by a frequency monitor,
wherein the comparing of the target frequency and the current frequency to generate the frequency comparison results is performed by an adder,
wherein the generating of the deciding results in response to the frequency comparison results is performed by a decide voltage module, and
wherein the target frequency module, the frequency monitor, the adder, the decide voltage module, the CPM, and the PLL are arranged in an outer loop operating in response to an outer loop period longer than the inner loop period.

* * * * *